(12) United States Patent
Yamazaki

(10) Patent No.: US 6,605,496 B1
(45) Date of Patent: Aug. 12, 2003

(54) METHOD OF FABRICATING A BOTTOM-GATE-TYPE THIN FILM TRANSISTOR USING A HEAT RELAXATION LAYER DURING LASER CRYSTALLIZATION

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/152,507

(22) Filed: Sep. 14, 1998

(30) Foreign Application Priority Data

Sep. 16, 1997 (JP) .............................. 9-270624

(51) Int. Cl.[7] ........................ H01L 21/84; H01L 21/336
(52) U.S. Cl. ........................ 438/166; 438/486; 438/487; 438/158
(58) Field of Search ................................ 438/166, 158, 438/486, 487

(56) References Cited

U.S. PATENT DOCUMENTS

| | | | | |
|---|---|---|---|---|
| 5,275,851 A | * | 1/1994 | Fonash et al. | ............... 438/166 |
| 5,466,617 A | * | 11/1995 | Shannon | ...................... 438/158 |
| 5,612,235 A | * | 3/1997 | Wu et al. | .................... 438/158 |
| 5,612,251 A | * | 3/1997 | Lee | .............................. 438/166 |
| 5,681,760 A | * | 10/1997 | Park | ............................. 438/158 |
| 5,773,848 A | | 6/1998 | Wu et al. | |
| 5,994,164 A | * | 11/1999 | Fonash et al. | .............. 438/166 |
| 6,146,929 A | * | 11/2000 | Oana et al. | ................. 438/166 |
| 6,156,590 A | * | 12/2000 | Yamazaki et al. | .......... 438/166 |
| 6,281,057 B2 | * | 8/2001 | Aya et al. | .................... 438/166 |
| 6,303,415 B1 | * | 10/2001 | Yamazaki | ................... 438/166 |

* cited by examiner

*Primary Examiner*—Mary Wilczewski
(74) *Attorney, Agent, or Firm*—Eric J. Robinson; Robinson Intellectual Property Law Office, P.C.

(57) ABSTRACT

Provided is a constitution for forming a polysilicon film having uniform crystallinity. To construct a structure of a bottom-gate-type TFT, a heat relaxation layer is formed to cover a gate electrode. The heat conductivity of the heat relaxation layer is lower than that of the gate electrode, and it acts to inhibit heat propagation to the gate electrode. In the step of laser crystallization of an amorphous silicon film into a polysilicon film, the heat relaxation layer prevents local temperature gradation in the film owing to the heat-absorbing effect of the underlying gate electrode. The polysilicon film formed has extremely excellent uniformity and crystallinity.

26 Claims, 9 Drawing Sheets

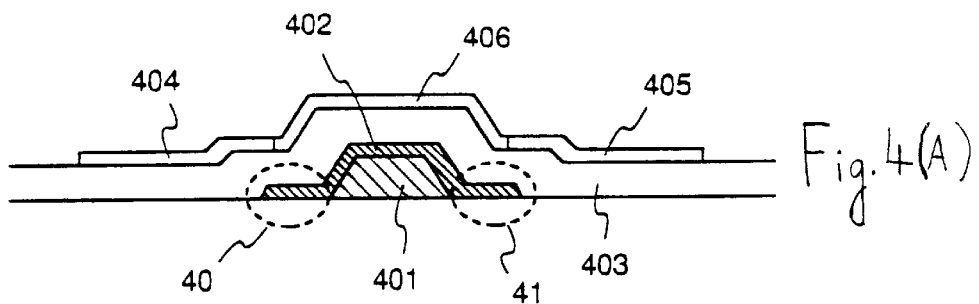
Fig. 4(A)
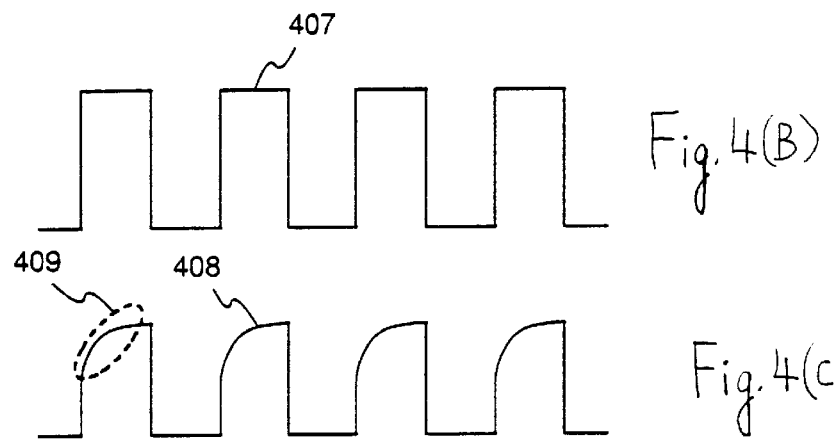
Fig. 4(B)
Fig. 4(C)
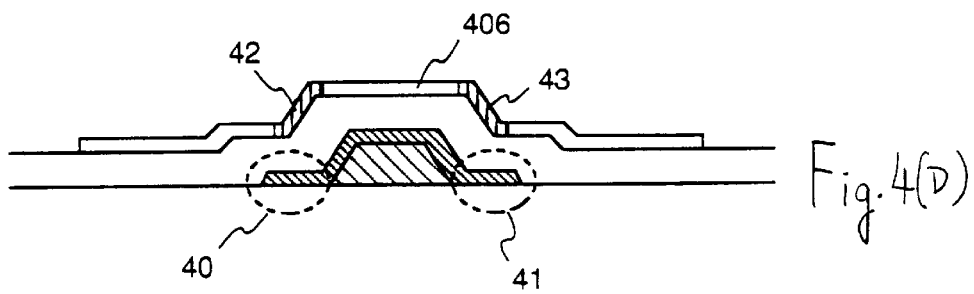
Fig. 4(D)

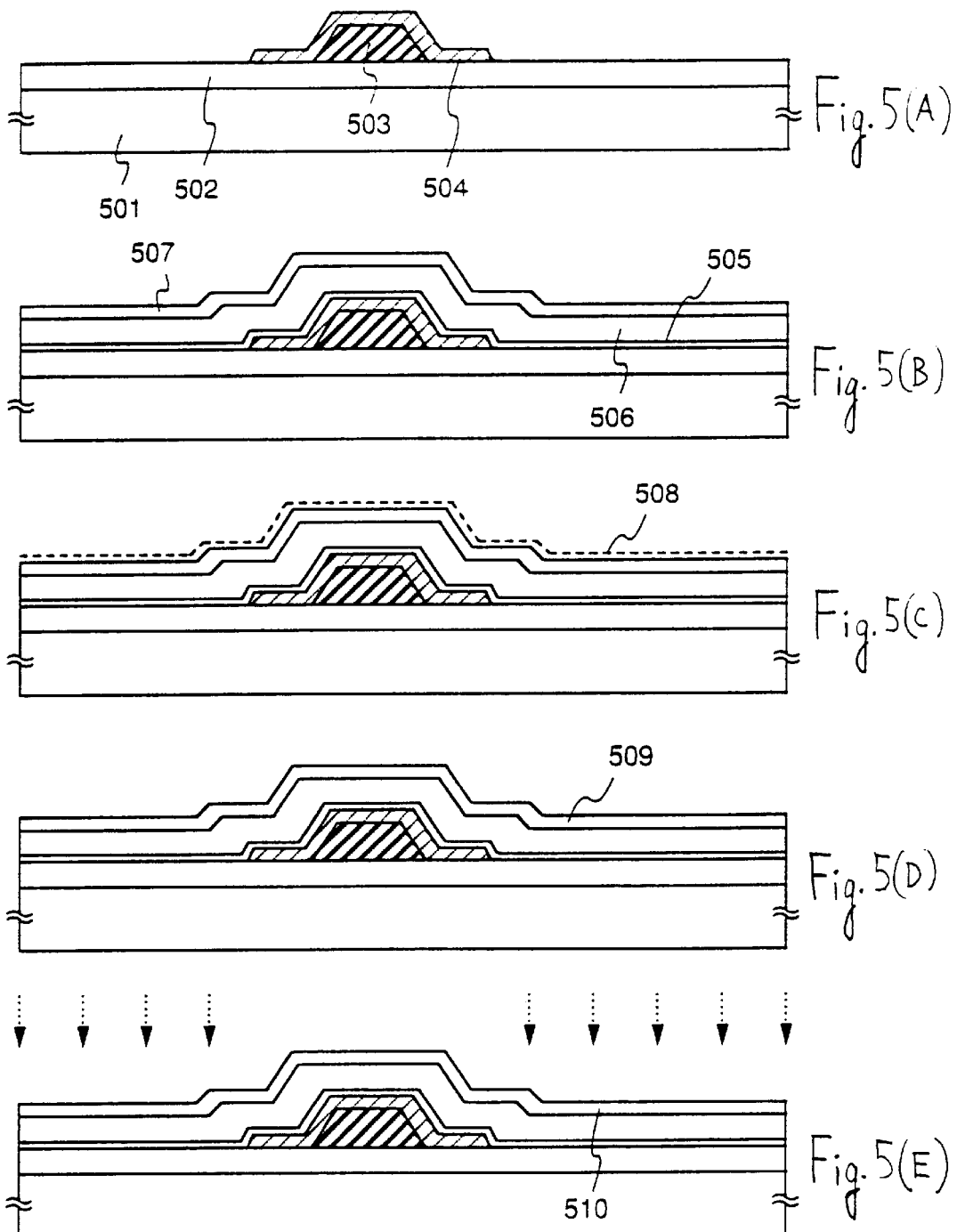

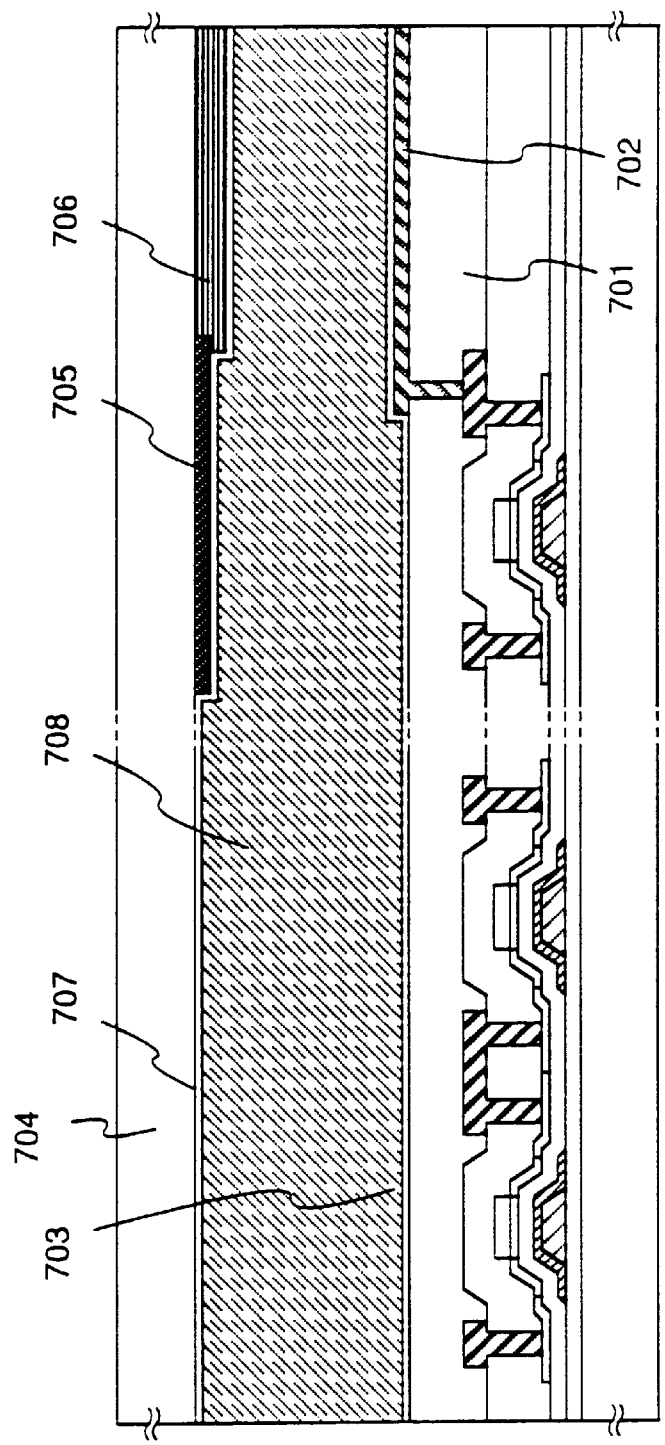

METHOD OF FABRICATING A BOTTOM-GATE-TYPE THIN FILM TRANSISTOR USING A HEAT RELAXATION LAYER DURING LASER CRYSTALLIZATION

FIELD OF THE INVENTION

The present invention relates to a semiconductor device comprising thin semiconductor films, and to a method for producing it. In particular, it relates to technology concerning the constitution of bottom-gate-type TFT.

The terminology "semiconductor device" referred to herein is directed to any and every device that functions on the basis of semiconductor characteristics. Accordingly, TFT, semiconductor circuits, electro-optical devices and electronic instruments referred to herein shall be all within the category of that terminology, semiconductor device.

BACKGROUND OF THE INVENTION

With great popularization of notebook-type personal computers, portable information terminals, etc. in recent years, there is increasing a great demand for active matrix-type liquid crystal devices (AMLCD). For those, techniques of producing thin film transistors (TFT) from thin semiconductor films formed on insulating substrate are being much promoted.

Thin film transistors are grouped into top-gate-structured ones (typically, planar-structured ones) and bottom-gate-structured ones (typically, inverse stagger-structured ones). Of those, widely noticed are AMLCD with circuits of bottom-gate-type TFT of which the structures are simple and the productivity is high.

At present, techniques for producing inverse stagger-type TFT comprising forming polysilicon films on a glass substrate are being developed, and some of them are being industrialized to produce commercial products.

For forming a polysilicon film on a glass substrate, generally employed is a means of crystallizing an amorphous silicon film through laser exposure. However, one problem with the laser crystallization is that polysilicon films with uniform crystallinity are difficult to obtain.

The crystallinity as referred to herein will be typically indicated by the grain size of crystals. The crystals of polysilicon films as formed through laser crystallization generally have relatively uniform grain sizes, but, as the case may be, their grain sizes will often vary depending on delicate changes in the starting amorphous silicon films (temperature, shape, etc.).

For example, in producing inverse stagger-type TFT, a gate-insulating film and an amorphous silicon film are laminated on a gate electrode in that order, and the resulting laminate is subjected to laser crystallization. Through our experiments, we, the present inventors have verified that, in the step of laser crystallization, the crystals of the polysilicon film formed just above the tapered area of the gate electrode shall have extremely small grain sizes and are therefore in a semi-crystalline condition.

The area just above the tapered area of the gate electrode is the most important region for the junction of a channel-forming region and a drain region, the junction of a channel-forming region and an LDD region or the like that governs the characteristics of TFT, and the polysilicon film as formed through the conventional laser crystallization shall have non-uniform grain sizes in that most important region, by which the characteristics of TFT are worsened.

The present invention has been made in consideration of the problems noted above, and its object is to provide a technique for forming a polysilicon film having a highly uniform grain size at least in the channel-forming region and the impurity-poor.region in TFT Gate electrodes made from a material consisting essentially of aluminium (Al) or copper (Cu) are favorable for a matrix circuit to be formed on a large-sized glass substrate, as their wiring resistance is be extremely small. Therefore, such a low-resistance material will be much more used in future for TFT wiring (including gate electrodes).

However, for example, when gate electrodes of aluminium are formed in inverse stagger-type TFT, the angle at their taper could be at most 60 ±20°. Therefore, as compared with those of any other materials, the aluminium gate electrodes are disadvantageous in that the active layers to be formed thereover shall have a great difference in level.

Experimental data have been disclosed that indicate that, in the step of laser crystallization of an amorphous silicon film, the film just above a gate electrode consisting essentially of aluminium or copper differs from that in the other area in the rate of heat absorption. This is because the gate material consisting essentially of aluminium or copper has high heat conductivity. Accordingly, the temperature of the film just above the gate electrode is locally lowered due to the heat-absorbing effect of the gate electrode.

In that situation, we, the present inventors have considered that the gate electrode, if having a large taper angle on a substrate, will produce a definite boundary of two regions of the overlying amorphous silicon film each having a different rate of heat absorption, thereby causing the great temperature change profile around the boundary during the crystallization of the film, and, as a result, the crystals of the polysilicon film as formed just above the tapered area of the electrode will have small grain sizes and will therefore be in a semi-crystalline condition.

The tapered area (edge) of the gate electrode is an extremely important region, as corresponding to the edge of a channel-forming region (that is, the source/drain junction). Therefore, it is desired that at least the polysilicon film to constitute a channel-forming region and an impurity-poor region does not have a crystallinity-disordered region such as that noted above.

As having been so mentioned hereinabove, the amorphous silicon film to be crystallized must have a uniform temperature distribution during the step of laser exposure in order that the crystals of the resulting polysilicon film to be a channel-forming region and a low concentration impurity region may have uniform grain sizes (or that is, the film to be such regions may have uniform crystallinity).

SUMMARY OF THE INVENTION

In order to attain the object noted above, one aspect of the present invention is to provide a semiconductor device comprising at least;

a gate electrode formed on a substrate having an insulating surface, a heat relaxation layer formed to cover said gate electrode, a gate-insulating layer formed on said heat relaxation layer, and a polysilicon film formed on said gate-insulating layer;

wherein the heat conductivity of said heat relaxation layer is lower than that of said gate electrode.

Another aspect of the invention is to provide a semiconductor device comprising at least;

a gate electrode formed on a substrate having an insulating surface, a heat relaxation layer formed to cover said gate electrode, a gate-insulating layer formed on said heat relaxation layer, and a polysilicon film formed on said gate-insulating layer;

wherein the heat conductivity and the electric conductivity of said heat relaxation layer are lower than those of said gate electrode.

In the constitution of the invention, the heat relaxation layer plays an extremely important part. Concretely, the heat propagation is relaxed by the heat relaxation layer, whereby the heat-absorbing effect of the gate electrode is attenuated to thereby make the energy of laser beams having been applied to an amorphous silicon film absorbed more efficiently by the amorphous component of the film.

Still another aspect of the invention is a method for producing a semiconductor device, which comprises;

a step of forming a gate electrode on a substrate having an insulating surface, a step of forming a heat relaxation layer to cover said gate electrode, a step of forming a gate-insulating layer on said heat relaxation layer, a step of forming an amorphous silicon film on said gate-insulating layer, and a step of exposing the amorphous silicon film to laser beams or to intense light of which the intensity is equivalent to that of laser beams, to thereby crystallize the film into a polysilicon film;

the method being characterized in that the heat conductivity of said heat relaxation layer is lower than that of said gate electrode.

Still another aspect of the invention is a method for producing a semiconductor device, which comprises;

a step of forming a gate electrode on a substrate having an insulating surface, a step of forming a heat relaxation layer to cover said gate electrode, a step of forming a gate-insulating layer on said heat relaxation layer, a step of forming an amorphous silicon film on said gate-insulating layer, a step of keeping or adding a crystallization-promoting catalyst element on said amorphous silicon film, a step of heating said amorphous silicon film to thereby crystallize it into a polysilicon film, and a step of exposing the polysilicon film to laser beams or to intense light of which the intensity is equivalent to that of laser beams, to thereby improve the crystallinity of said polysilicon film, the method being characterized in that the heat conductivity and the electric conductivity of said heat relaxation layer are lower than those of said gate electrode.

BRIEF DESCRIPTION OF THE DRAWINGS

FIG. 4(A) to FIG. 4(D) show the constitution of another bottom-gate-type TFT of the invention.

FIG. 5(A) to FIG. 5(E) and FIG. 6(A) to FIG. 6(C) show another process for producing a bottom-gate-type TFT of the invention.

FIG. 7 shows the constitution of AMLCD of the invention.

In FIG. 1(A), 101 is a glass substrate, 102 is an underlying film, 103 is a gate electrode, 104 is a heat relaxation layer, 105 is a silicon nitride film, 106 is a silicon oxynitride film, 107 is a source region, 108 is a drain region, 109 and 110 are low concentration impurity regions, 111 is a channel-forming region, 112 is a channel-protecting film 113 is an interlayer insulating film, 114 is a source electrode, and 115 is a drain electrode.

DESCRIPTION OF PREFERRED
EMBODIMENTS OF THE INVENTION

Figure 1A:
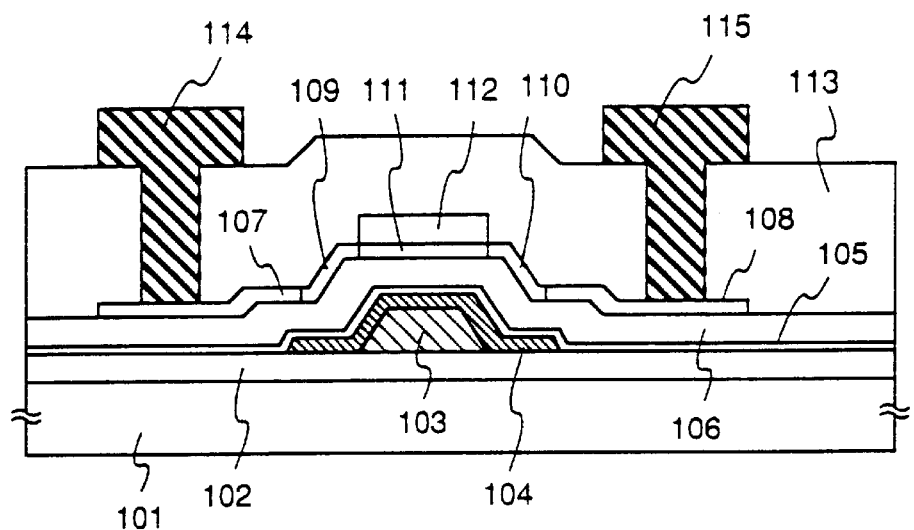
FIG. 1(A) and FIG. 1(B) show the constitution of a bottom-gate-type TFT of the invention.

One embodiment of the constitution of the present invention applied to an inverse stagger-type TFT is described below, with reference to FIG. 1(A) and FIG. 1(B). FIG. 1(A) is a cross-sectional view of an inverse stagger-type TFT of the invention, as cleaved in the channel direction (that is, in the direction in which the source and the drain are connected with each other).

In FIG. 1(A), 101 is a glass substrate (or a quartz or silicon substrate), 102 is an underlying film of a silicon oxide film (including a thermally-oxidized film), 103 is a gate electrode of aluminium or of a material consisting essentially of aluminium, and 104 is a heat relaxation layer which is the most important constitution of the invention.

In this, 105 is a silicon nitride film, 106 is a silicon oxynitride film (represented by SiOxNy), and these function as gate-insulating layers. 107 is a source region, 108 is a drain region, 109 and 110 are low concentration impurity regions (these may be referred to as LDD regions), and 111 is a channel-forming region.

112 is a pattern of a silicon oxynitride film, and this acts to protect the channel-forming region 111. Above this structure, provided is an interlayer insulating film 113 of an organic resin film, and formed are a source electrode 114 and a drain electrode 115.

In the inverse stagger-type TFT of the invention having the constitution noted above, the function of the heat relaxation layer 104 is described below.

Figure 1B:
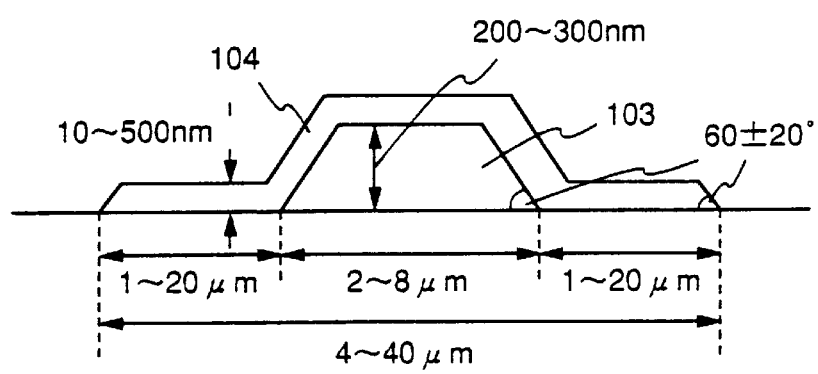
Figure 2A:
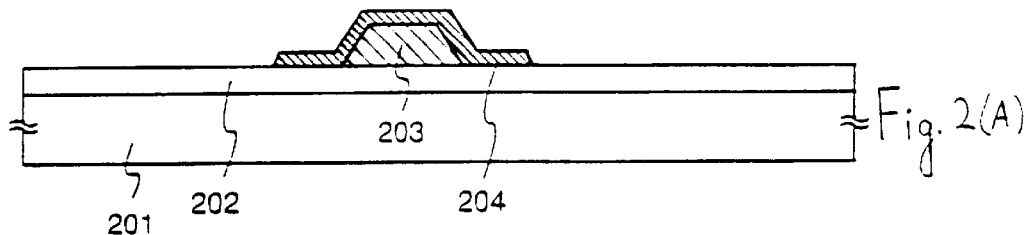
FIG. 2(A) to FIG. 2(D) and FIG. 3(A) to FIG. 3(C) show a process for producing a bottom-gate-type TFT of the invention.
Figure 2B:
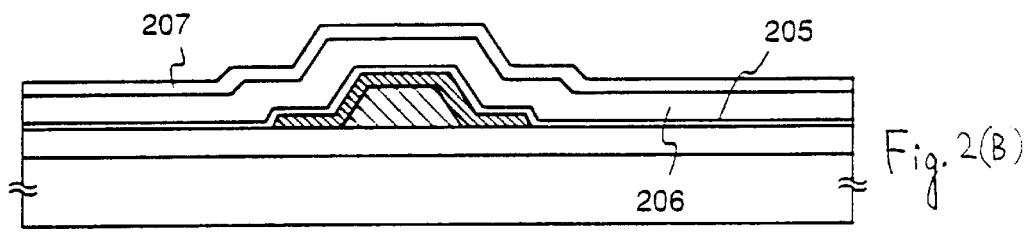
Figure 2C:
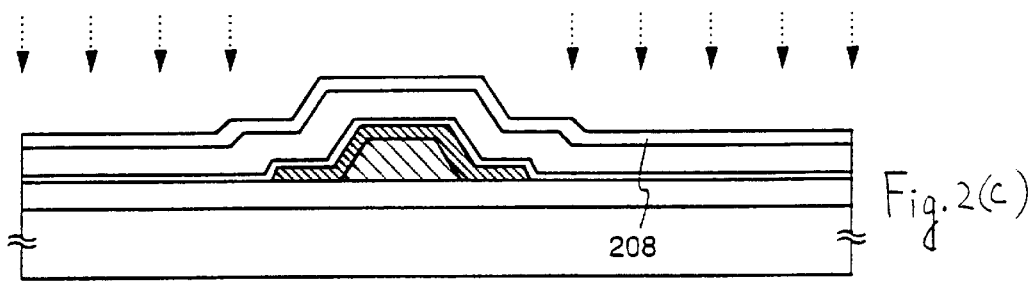
Figure 2D:
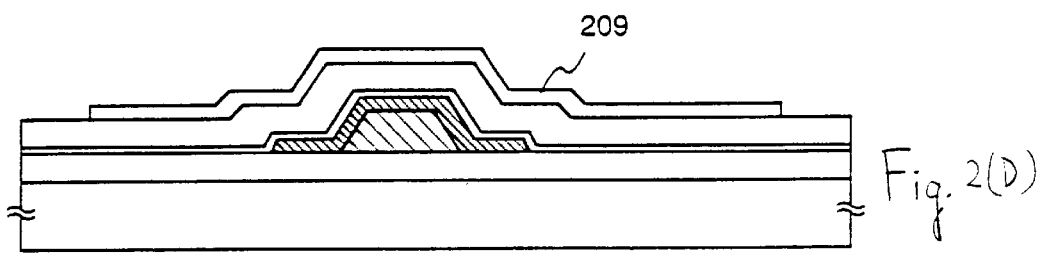

FIG. 1(B) is an enlarged view showing the gate electrode 103 and the heat relaxation layer 104. As illustrated, the width (L1) of the gate electrode 103 is approximately between 2 and 8 $\mu$m (typically between 3 and 5 $\mu$m). Its thickness is approximately between 200 and 300 nm. On the other hand, the width (L2) of the heat relaxation layer 104 is approximately between 4 and 40 $\mu$m (typically between 10 and 20 $\mu$m), and the heat relaxation layer 104 is formed to cover the gate electrode 103. Its thickness may be approximately between 10 and 500 nm (typically between 20 and 200 nm).

As in FIG. 1(B), in which the gate electrode 103 covered with the heat relaxation layer 104 is cleaved in the channel direction, the heat relaxation layer 104 is so patterned that it extends over the both edges of the gate electrode within a range of from 1 to 20 $\mu$ in the channel direction.

The heat relaxation layer 104 is composed of one or more materials selected from titanium (Ti), silicon (doped Si or undoped Si), chromium (Cr), tantalum silicide (TaSi$_x$), molybdenum silicide (MoSi$_x$), and tungsten silicide (WSi$_x$). The doped Si means a silicon film exhibiting one conductivity; while the undoped Si means a silicon film to which no impurity is intentionally added.

As compared with the gate electrode 103, it is desirable that the heat relaxation layer 104 is made from a material satisfying the three requirements of (1) lower heat conductivity, (2) lower electric conductivity, and (3) higher heat resistance.

Where the gate electrode 103 is made from aluminium or from a material consisting essentially of aluminium, its electric conductivity shall be about $5 \times 10^5$ $\Omega^{-1}$cm$^{-1}$. Preferably, the electric conductivity of the heat relaxation layer 104 is lower than that of the gate electrode 103. Concretely, it may fall between $1 \times 10^4$ and $2 \times 10^5$ $\Omega^{-1}$cm$^{-1}$, more preferably between $2 \times 10^4$ and $1 \times 10^5$ $\Omega^{-1}$cm$^{-1}$.

In the invention, the heat relaxation layer 104 is made from a material of which the heat conductivity is lower than that of the gate electrode 103 (concretely, the heat conductivity of the heat relaxation layer 104 is at most 50% of that of the gate electrode 103). In the constitution illustrated herein, the heat conductivity ($\kappa$) of the gate electrode 103 is from 200 to 400 Wm$^{-1}$K$^{-1}$, and it is desirable that the heat conductivity of the heat relaxation layer 104 is lower than that of the gate electrode (concretely, falling between 10 and 200 Wm$^{-1}$K$^{-1}$, more preferably between 20 and 100 Wm$^{-1}$K$^{-1}$).

The heat resistance of the gate electrode 103 and the heat relaxation layer 104 may be such that they are resistant to heat absorption to be caused by laser exposure. The heat of laser beams applied to the structure illustrated shall be propagated to heat relaxation layer 104 and to the gate electrode 103 via the insulating layers such as the silicon oxynitride film 106 and others. Therefore, all the examples of the materials for those 103 and 104 noted above are employable herein with no problem.

In the semiconductor device of the present invention, disposed is the heat relaxation layer 104 that covers the gate electrode 103, by which the difference in temperature between the region just above the gate electrode 103 and the other region in the step of laser crystallization of the amorphous silicon film is relaxed. Specifically, in the laser crystallization step, the heat propagation to the gate electrode 103 is inhibited by the heat relaxation layer 104, by which the heat-absorbing effect of the gate electrode 103 is attenuated.

Accordingly, in the step of laser crystallization of the amorphous silicon film, the local temperature depression only in the region of the film just above the gate electrode 103 is prevented, thereby resulting in that the amorphous silicon film can be crystallized uniformly throughout it because of the absence of temperature gradation in the film around the gate electrode 103. As a result, the amorphous silicon film can be crystallized smoothly into a polysilicon film having extremely good crystallinity.

The invention having the constitution noted above is described in more detail with reference to the following Examples, which, however, are not intended to restrict the scope of the invention.

EXAMPLE 1

This is to demonstrate a process for producing an inverse stagger-type TFT according to the present invention. FIG. 2(A) to FIG. 2(D) and FIG. 3(A) to FIG. 3(C) are referred to herein.

First formed is an underlying film 202 of a silicon oxide film on a glass substrate 201. The thickness of the underlying film 202 may be around 200 nm. Next, a gate electrode 203 of a material consisting essentially of aluminium is formed on the underlying film 202. The thickness of the gate electrode 203 may be 250 nm. In this Example, the gate electrode 203 is of an aluminium film containing 2 wt. % of scandium.

After having been formed, the gate electrode 203 may be subjected to anodic oxidation to form an oxide film (not shown) thereon, which is effective for increasing the heat resistance of the gate electrode 203 (that is, for preventing the formation of hillocks thereon).

Next, a heat relaxation layer 204 is formed to cover the gate electrode 203. In this Example, the heat relaxation layer 204 is of a titanium film having a thickness of 100 nm. In this step, the heat relaxation layer 204 is so patterned that it extends over the both edges of the gate electrodes 203 in the horizontal direction by about 2 $\mu$m or so to have the structure of FIG. 1(B). (FIG. 2(A))

In this process, the gate electrode 203 and the heat relaxation layer 204 may be patterned through dry etching. Even if the gate electrode 203 is patterned relatively steeply to have a tapered angle of 60±20°, such is not problematic in the invention.

Next, a silicon nitride film 205 is formed to have a thickness of 50 nm, and a silicon oxynitride film 206 is further formed thereover to have a thickness of 200 nm. In this Example, the laminate of those films acts as an insulating layer. Of the laminate, the silicon nitride film 205 further acts as a passivation film that prevents the constituent elements (aluminium and titanium herein) of the gate electrode 203 and the heat relaxation layer 204 from moving into the gate-insulating layer.

After the gate-insulating layer has been formed, an amorphous semiconductor film 207 is formed thereover. In this Example, an amorphous silicon film having a thickness of from 10 to 100 nm (typically from 10 to 75 nm, but preferably from 15 to 45 nm) is formed as the film 207. In place of the amorphous silicon film, also employable is an amorphous semiconductor compound of Si$_x$Ge$_{1-x}$ (0<x<1) to form the film 207. (FIG. 2(B))

After the amorphous silicon film 207 has been formed, it is exposed to laser beams for crystallization. In this Example, used is a pulse oscillation-type KrF excimer laser ray having been modulated into a linear ray. For the exposure, the oscillation frequency may be 30 Hz, the scanning speed may be 2.0 mm/sec, and the energy intensity may be 315 mJ/cm$^2$. (FIG. 2(C))

In place of KrF, also employable is any of XeCl excimer laser or YAG laser.

In the step of laser exposure, the substrate being processed is kept at a temperature falling between room temperature and 500° C. (preferably between 200 and 400° C.). In the step, laser irradiation onto the substrate being heated produces a crystalline semiconductor film having high uniformity. This is because the auxiliary heating could reduce the necessary energy intensity of the laser ray thereby ensuring laser oscillation at a stable output.

The laser crystallization gives the crystalline semiconductor film (in this Example, the polysilicon film) 208. In the step of layer crystallization in this Example, the heat absorbability of the gate electrode 203 is attenuated by the effect of the heat relaxation layer 204.

As a result, the amorphous silicon film could uniformly absorb the energy of the laser ray and is crystallized through extremely smooth crystal growth therein. In particular, even in the region just above the tapered part of the gate electrode, no temperature gradation is formed in the silicon film being crystallized, and the film is crystallized smoothly.

Accordingly, the polysilicon film 208 as formed in the constitution of this Example has a uniform grain size throughout it, without having any disordered region including semi-crystalline regions. Specifically, the film 208 is a semiconductor film having extremely excellent crystallinity.

Next, the resulting polysilicon film is patterned to form an active layer 209. (FIG. 2(D))

After the active layer 209 has been formed, a mask 210 of a silicon oxynitride film (or a silicon nitride film, as the case may be) is formed thereover through patterning, and an impurity element, which is for forming source/drain regions in the later step, is added to the layer 209 via the mask 210. The addition may be attained through ion implantation (with mass separation) or ion doping (without mass separation). Thus are formed impurity regions 211 and 212 (FIG. 3(A))

As the impurity element, used is phosphorus (P), arsenic (As) or antimony (Sb) for forming N-channel TFT. For forming P-channel TFT, used is boron (B), gallium (Ga) or indium (In).

Next, the mask 210 is again patterned to have a shape 213, and the same impurity element as in the previous step is again added to the active layer via the thus-patterned mask 213. In this step, the concentration of the impurity element to be added shall be smaller than that added in the previous step. (FIG. 3(B))

As a result of the impurity-adding step repeated twice, formed are a source region 214, a drain region 215, low concentration impurity regions (these may be referred to as LDD regions) 216 and 217, and a channel-forming region 218.

In this process, the concentration of the impurity element to be in the source region 214 and the drain region 215 is defined by the total amount of the impurity element having been added in the impurity-adding step repeated twice, and the condition for impurity addition shall be so controlled that the impurity concentration in those regions 214 and 215 could fall between $5 \times 10^{19}$ and $1 \times 10^{21}$ atoms/cm$^3$. On the other hand, the concentration of the impurity element in the low concentration impurity regions 216 and 217 is defined by the amount of the impurity element having been added in the second impurity-adding step, and the condition for the second impurity-adding step shall be so controlled that the impurity concentration in those regions 216 and 217 could fall between $5 \times 10^{17}$ and $5 \times 10^{18}$ atoms/cm$^3$.

The channel-forming region 218 is an undoped region to which no impurity element is intentionally added, and this shall be an intrinsic or substantially intrinsic region. The wording, substantially intrinsic region as referred to herein indicates a region in which the impurity concentration is not higher than the spin density of the polysilicon film, or a region that exhibits one conductivity within a range within which the threshold voltage is controllable.

Figure 3A:
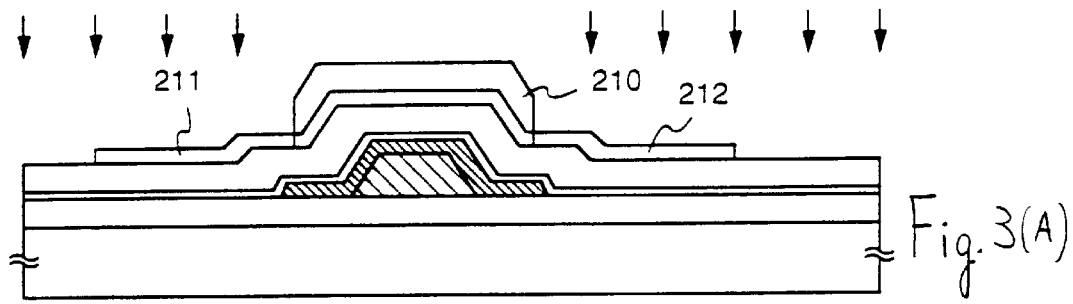
Figure 3B:
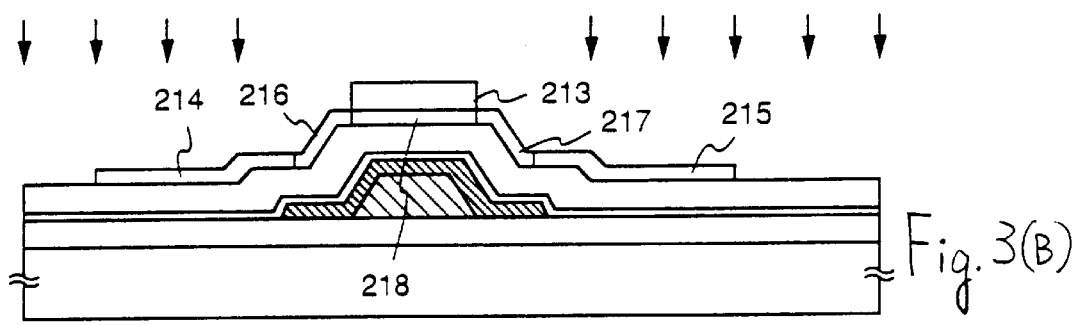

The structure of FIG. 3(B) is then subjected to layer exposure via the mask 213 to thereby active the impurity element. The laser activation via the mask 213 prevents the back diffusion of the impurity from the low concentration impurity regions 216 and 217 to the channel-forming region 218.

In this step of laser exposure for activating the impurity element, the active layer having been made amorphous by the previous ion implantation could be again crystallized.

Next, while the mask 213 is still as it is, an interlayer insulating film 219 of a silicon oxide film, a silicon nitride film, a silicon oxynitride film, or an organic resin film (polyimide, polyamide, polyimidamide, acrylic resin, etc.), or a laminate of such films is formed to have a thickness of from 0.5 to 3 µm. In this Example, formed is a polyimide film having a thickness of 2 µm through spin coating, as the film 219.

The mask 213 acts as a channel-protecting film, by which the direct contact of the channel-forming region 218 with the interlayer insulating film 219 is prevented. The structure of this type is extremely effective when the interlayer insulating film 219 is made of an organic resin film, as it prevents organic contamination of the channel-forming region 218 with the organic resin film.

After the interlayer insulating film 219 has been formed, contact holes are formed through the source/drain regions, in which are formed a source electrode 220 and a drain electrode 221. In this Example, a laminate film of aluminium and titanium films is used to form the source/drain electrodes.

Finally, the thus-constructed structure is hydrogenated by heating it in a hydrogen atmosphere at 350 to 400° C. for 2 hours or so. In this hydrogenation step, the dangling bonds in the active layer are terminated with hydrogen, whereby the electric characteristics of the TFT formed are greatly improved.

Figure 3C:
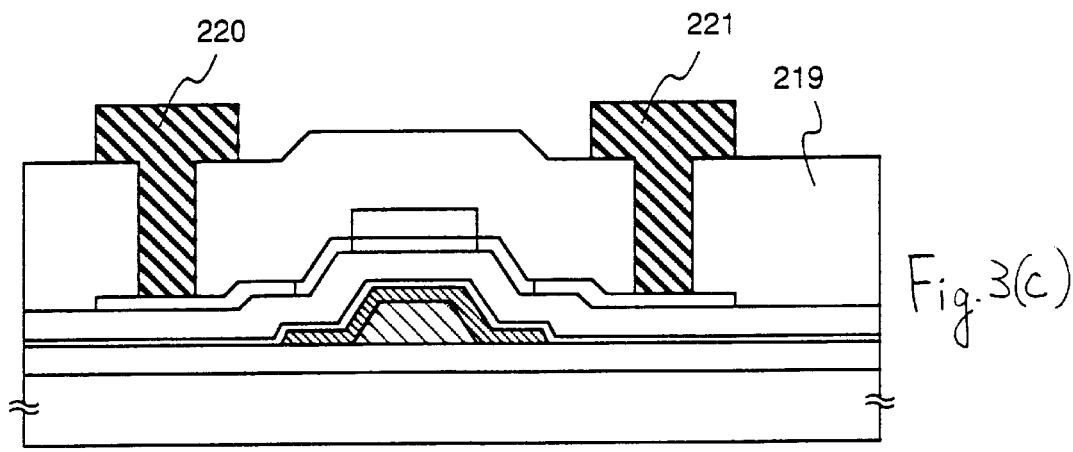
Figure 6A:
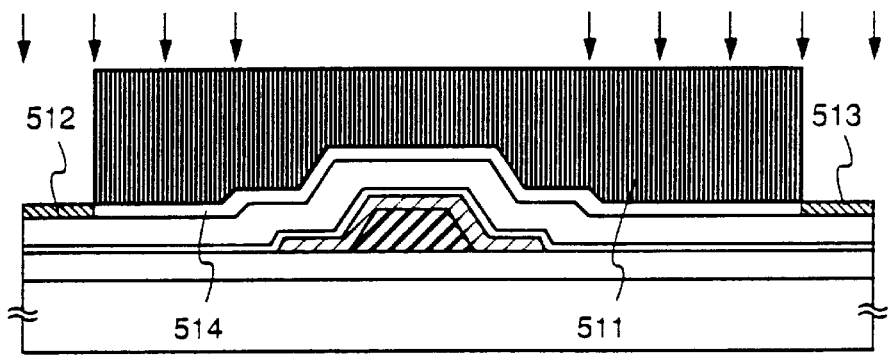
Figure 6B:
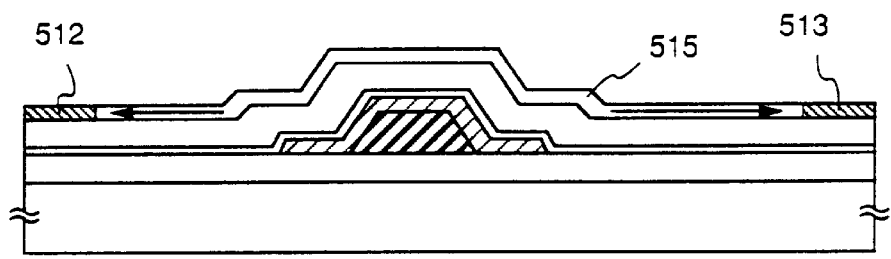
Figure 6C:
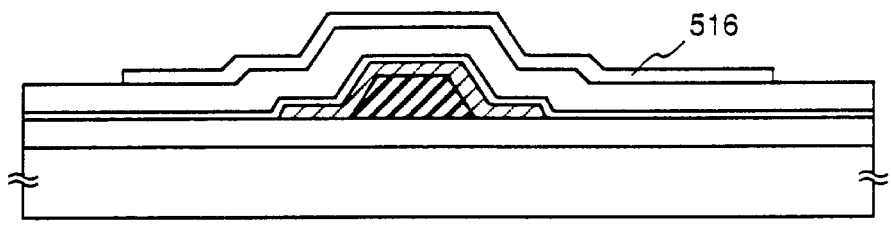

As a result of the process noted above, completed is an inverse stagger-type TFT having the structure of FIG. 3(C). The present invention is not limited to the embodiment of this Example, but is applicable to any and every type of bottom-gate-type TFT.

EXAMPLE 2

In Example 1, the LDD regions are so formed that they sandwich the channel-forming region therebetween. In the constitution of the present invention, however, regions capable of substantially functioning as LDD regions could be naturally formed without intentionally forming LDD regions. This Example is to demonstrate the effect of the case.

As has been already mentioned hereinabove, it is desirable that, as one necessary property of the heat relaxation layer, the electric conductivity (σ) of the heat relaxation layer is smaller than that of the gate electrode. The electric conductivity of the heat insulating layer significantly participates in the effect of the embodiment of this Example.

In order that the embodiment of this Example could significantly exhibit its effect, it is desirable to use a silicon film for forming the heat relaxation layer. The silicon film is preferably a substantially intrinsic film (of undoped Si), but, as the case may be, it may be a conductive film (of doped Si).

A TFT having the structure of FIG. 4(A) is taken into consideration. In FIG. 4(A), 401 is a gate electrode, 402 is a heat relaxation film of an undoped silicon film to which no impurity is intentionally added, 403 is a gate-insulating layer, 404 is a source region, 405 is a drain region, and 406 is a channel-forming region. For the others than those, referred to is the structure of FIG. 3(C).

Where the TFT having the structure of the illustrated type is AC-driven as a pixel switching element in a liquid crystal display device, a regular pulse voltage 407 as in FIG. 4(B) is imparted to the gate electrode 401.

However, in this structure, since the electric conductivity of the heat relaxation layer 402 is smaller than that of the gate electrode 401, the response speed of the former to the pulse voltage is lower than that of the latter to the same. As a result, in the regions 40 and 41 of the heat relaxation layer 402 that do not overlap with the gate electrode 401, the layer 402 could not follow the pulse voltage having been imparted to the gate electrode 401, resulting in that the signal delay designated by 409 is seen in those regions 40 and 41, as in the pulse voltage 408 in FIG. 4(C).

Accordingly, in the regions 40 and 41, the voltage could no reach the intended value within the selective period for the gate electrode. As a result, the field intensity to be applied to the regions 42 and 43 that are just above the regions 40 and 41 shall be lower than that to the other regions.

Accordingly, the field intensity to be applied to the junction between the source/drain region and the channel-forming region is weakened, or that is, the regions 42 and 43 in the illustrated structure are to function substantially as LDD regions. The effect of those regions 42 and 43 is significant for inhibiting the deterioration of the junction between the drain region and the channel-forming region.

As mentioned herein, the structure of the present invention naturally provides regions that function substantially as LDD regions because of the characteristics peculiar to the structure itself. According to the invention, therefore, it is possible to produce TFT having extremely excellent pressure resistance. The embodiment of Example 1 where the LDD regions are intentionally formed may be combined with the embodiment of this Example 2 to attain better synergistic effects.

EXAMPLE 3

In Example 1, aluminium or a material consisting essentially of aluminium is used for forming the gate electrode. Apart from this, copper (Cu) or a material consisting essentially of copper may also be used for forming the gate electrode. As having a higher electric conductivity than aluminium, copper may form an electrode wiring pattern having lower resistance.

In addition, as having better heat resistance than aluminium, copper may have a larger margin in process designing. Since the lowermost layer of the gate-insulating layer is made of a silicon nitride film, copper of the gate electrode does not diffuse into the active layer.

EXAMPLE 4

Herein demonstrated is an embodiment of producing an inverse stagger-type TFT according to a process that is different from the process in Example 1. Referred to are FIG. 5(A) to FIG. 5(E) and FIG. 6(A) to FIG. 6(C).

First, an underlying film 502 of a silicon oxide film is formed on a glass substrate 501. A gate electrode 503 and a heat relaxation layers 504 are formed on the film 502. In this Example, a material consisting essentially of copper is used for forming the gate electrode 503, and the thickness of the gate electrode 503 is 300 nm. A silicon film having N-type conductivity is used for forming the heat relaxation layer 504, and the thickness of the layer 504 is 50 nm. (FIG. 5(A))

Next, a gate-insulating layer is formed, which has a laminate structure composed of a silicon nitride film 505 having a thickness of 50 nm and a silicon oxynitride film 506 having a thickness of 200 nm. An amorphous silicon film 507 having a thickness of 75 nm is formed on the gate-insulating layer. (FIG. 5(B))

Next, the amorphous silicon film 507 is crystallized according to the technique of Example 1 in the present inventors' own Japanese Patent Application Laid-Open (JP-A) Hei-7-130652. The technique illustrated in that patent publication is to crystallize an amorphous silicon film in the presence of a catalyst element for promoting the crystallization to thereby obtain a crystalline silicon film having good crystallinity.

First, an aqueous solution of nickel acetate having a nickel content of 10 ppm by weight is applied over the amorphous silicon film 507 through spin coating to form a nickel-containing layer 508. As a result, the amorphous silicon film 507 shall have nickel on its surface. (FIG. 5(C))

In place of nickel, also employable is any of iron (Fe), cobalt (Co), copper (Cu), palladium (Pd), platinum (Pt), gold (Au), germanium (Ge) or lead (Pb).

After the nickel-containing layer 508 has been formed, this is heated (for hydrogen removal) at 450 to 500° C. for 2 hours or so, and then further heated at 500 to 700° C. (typically at 550 to 600° C.) for 2 to 12 hours (typically for 4 to 8 hours) to form a polysilicon film 509. (FIG. 5(D))

Next, this is exposed to layer beams whereby the crystallinity of the polysilicon film 509 is improved. In this step, the intragranular defects in the film 509 are reduced, the disordered grain boundaries therein are reduced, and the amorphous components still remaining therein are crystallized. (FIG. 5(E))

In the laser exposure step, the heat relaxation layer 504 exhibits its effect, by which the laser energy is uniformly imparted to the polysilicon film. Therefore, as a result of this step, the crystallinity and also the uniformity of the resulting polysilicon film 510 are much improved.

After the crystallinity of the polysilicon film has been improved in that manner, a resist mask 511 is formed on the film to mask the region to be an active layer in the later step. Next, an element selected from Group 15 (phosphorus in this Example) is added to the film through ion implantation or ion doping. In this step, the phosphorus concentration to be in the resulting polysilicon film is so controlled as to fall between $1 \times 10^{19}$ and $1 \times 10^{21}$ atoms/cm$^3$ (typically between $1 \times 10^{20}$ atoms/cm$^3$).

As a result of this step, formed are phosphorus-rich regions (hereinafter referred to as gettering regions) 512 and 513. Just below the resist, formed is a phosphorus-free region (hereinafter referred to as a to-be-gettered region) 514. (FIG. 6(A))

Next, this is heated at 500 to 700° C. (typically at 600 to 650° C.) for 4 to 16 hours (typically for 8 to 12 hours), whereby nickel remaining in the to-be-gettered region 514 is moved to the gettering regions 512 and 513. The technique employed herein is to utilize the metal-gettering ability of phosphorus. (FIG. 6(B))

In this Example, TFT is formed on the glass substrate. In this, therefore, the highest temperature acceptable in the process is defined by the heat resistance of glass. Apart from the glass substrate, if a substrate having higher heat resistance such as a quartz glass or the like is used, the highest temperature for the heat treatment for gettering may be up to 1000° C. (preferably up to 800° C.). However, if the temperature in the step is higher than 800° C, phosphorus will be back-diffused from the gettering regions to the to-be-gettered region at such a high temperature. Therefore, the temperature is preferably not higher than 1000° C.

From the gettered region 515 formed as a result of the step, the metal element, nickel is gettered away, resulting in that the region 515 is an extremely pure region having a much reduced impurity content. Next, after the pure region has been formed therein, the polysilicon film is patterned to form an active layer 516 of only the gettered region 515. (FIG. 6(C))

This is thereafter processed according to the steps of FIG. 3(A), FIG. 3(B) and FIG. 3(C) as in Example 1, and an inverse stagger-type TFT having the structure of FIG. 3(C) is completed.

In this Example, employed is the technique of Example 1 in JP-A Hei-7-130652 for crystallizing the amorphous silicon film. Apart from this, the technique of Example 2 in JP-A Hei-7-130652 is also applicable to the present invention to produce the same results. In the embodiments illustrated in JP-A Hei-7-130652, the catalyst element is applied to the film through spin coating. Apart from such spin coating, ion implantation or the like means is also employable herein for directly adding the catalyst element to the amorphous silicon film.

As demonstrated in this Example, the constitution of the present invention is not limited to only laser crystallization, but is applicable to any and every process comprising a step of exposing the entire surface of a film to laser beams.

EXAMPLE 5

In the embodiments of Examples 1 and 4, employed is laser exposure for crystallizing the amorphous film and for improving the crystallinity of the resulting crystalline film. In place of using laser beams in those, also employable is intense light of which the intensity is equivalent to that of laser beams.

For this, known is an annealing technique of RTA (rapid thermal annealing). In RTA, a film to be treated is exposed to intense light having been emitted by an IR lamp while it is heated at a temperature falling between 800 and 1000° C. or so for a few seconds.

Also in this case, the film being treated is heated by the energy of the intense light applied thereto, while it is exposed to temperature gradation owing to the heat-absorbing effect of the gate electrode underlying it, like in the case of laser exposure. Therefore, the constitution of the present invention is extremely favorable also to the heat treatment with such intense light.

EXAMPLE 6

In the processes of Example 1 and Example 4, it is effective to intentionally add an element selected from Group 13 or Group 15 to the silicon film so as to control the threshold voltage of TFT to be produced. This is known as a channel-doping technique.

In this case, where the threshold voltage having been shifted to the minus side is re-shifted to the plus side, an element of Group 13 (typically boron) is added to the silicon film; but, on the contrary, where the threshold voltage having been shifted to the plus side is re-shifted to the minus side, an element of Group 15 (typically phosphorus) is added thereto.

The constitution of this Example can be combined with any of the constitutions of Examples 1 to 6.

EXAMPLE 7

This is to demonstrate an embodiment of producing AMLCD (active matrix-type liquid crystal display), which comprises forming a plurality of N-channel inverse-stagger TFT (hereinafter referred to as NTFT) and a plurality of P-channel inverse-stagger TFT (hereinafter referred to as PTFT) on one and the same substrate.

In the AMLCD of this Example, the pixel matrix circuit is composed of NTFT, and the driver circuit and the other logic circuits (D/A converter, γ-correction circuit, memory, etc.) are of CMOS circuits of NTFT and PTFT as combined complementarily.

For the process of producing NTFT and PTFT in this Example, referred to is the process of Example 1 or Example 4. Needless-to-say, it is easy to combine the constitution of this Example with any of the constitutions of Examples 2, 3 and 5. CMOS circuits could be easily produced by forming NTFT and PTFT on one and the same substrate according to known techniques.

FIG. 7 is a cross-sectional view of AMLCD of this Example, in which the left-handed side indicates a driver circuit and the right-handed side indicates a pixel matrix circuit. In the illustrated AMLCD, TFT could be produced according to the process of Example 1 or 4, of which the details are omitted herein. TFT for the driver circuit is finished in the condition of FIG. 3(C). However, when TFT for constituting the pixel matrix circuit (pixel TFT) is formed on the same substrate, additional pixel electrodes must be formed thereon.

For this, concretely, the structure of FIG. 3(C) (but not hydrogenated) is processed to form a planarizing film 701 and a pixel electrode 702 thereon, and then hydrogenated. For the planarizing film 701, favorable is an organic resin film.

For transmission-type LCD, the pixel electrode 702 may be of a transparent conductive film (typically ITO); but for reflection-type LCD, it may be of a metal film having high reflectivity (typically an aluminium alloy film).

Finally, an aligned film 703 is formed over the planarizing film 701 and the pixel electrode 702 to complete an active matrix substrate (TFT substrate).

Next, a counter substrate is prepared as in FIG. 7, in which 704 is a glass substrate, 705 is a black matrix of a light-shielding film, 706 is a color filter corresponding to any of R-G-B, and 707 is a counter aligned film.

The active matrix substrate and the counter substrate are adhered to each other via a spacer or a sealant material, and a liquid crystal layer 708 is sealed in the two with a sealant material. As a result of this process, completed is AMLCD of FIG. 7.

AMLCD of this Example comprises inverse stagger-type TFT for the driver circuit and the pixel matrix circuit both formed on one and the same substrate. In this, the basic constitution of the driver circuit comprises a CMOS circuit, and the power to be consumed by the driver circuit is low.

In the structure of FIG. 7, a black matrix is formed on the counter substrate, but, as the case may be, it may be formed on the active matrix substrate (BM-on-TFT) but not on the counter substrate. The BM-on-TFT structure of that type is favorable to the production of much finer wiring patterns.

AMLCD of FIG. 7 comprises a color filter. In the absence of a color filter, the device may be driven in an ECB (electric field control birefringence) mode, a GH (guest-host) mode or the like.

Like the technique disclosed in JP-A Sho-8-15686, the device of this Example may be combined with a micro-lens array.

The structure of AMLCD illustrated herein is one embodiment and is not limitative. Without being limited to the illustrated embodiment, the present invention is applicable to any other structures of AMLCD.

Figure 8A:
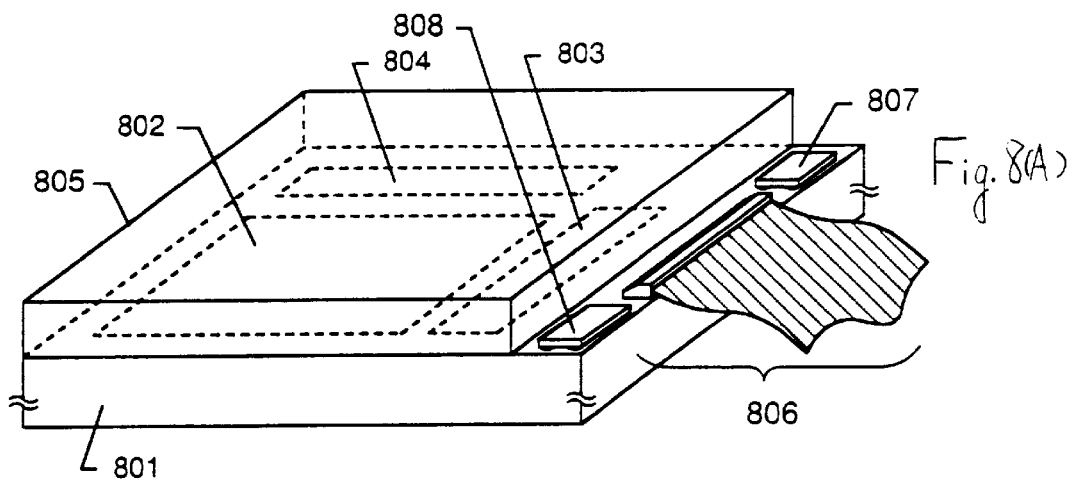
FIG. 8(A) and FIG. 8(B) each show the constitution of AMLCD of the invention.
Figure 8B:
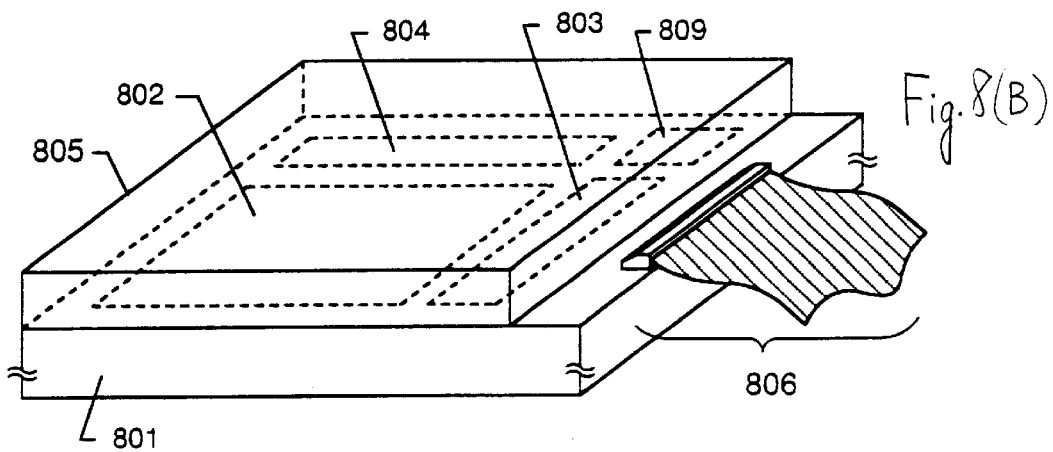

FIG. 8(A) and FIG. 8(B) show the outward appearance of the AMLCD of this Example. In FIG. 8(A), 801 is an active matrix substrate, on which is mounted a TFT of the invention that comprises a pixel matrix circuit 802, a source driving circuit 803 and a gate driving circuit 804. In this, 805 is a counter substrate.

The active matrix substrate 801 and the counter substrate 805 are stuck together with their one end being aligned. At the other end, the counter substrate 805 is partly cut, and FPC (flexible print circuit) 806 is connected with the exposed area of the active matrix substrate. Via the FPC 806, external information is transmitted into the inside of the circuit.

On the exposed area of the active matrix substrate connected with the FPC 806, mounted are IC chips 807 and 808. These IC chips comprise various circuits, such as video information-processing circuit, timing pulse-generating circuit, γ-correcting circuit, memory circuit, arithmetic circuit, etc., as formed on silicon substrates. In FIG. 8(A), two IC chips are mounted on the active matrix substrate. However, one IC chip or three or more IC chips may be mounted thereon.

FIG. 8(B) is another modification of AMLCD of this Example. In FIG. 8(A) and FIG. 8(B), the same parts are represented by the same numeral references. The embodiment of FIG. 8(A) differs from that of FIG. 8(B) in that the signal information as processed by the IC chips in FIG. 8(A) is processed by the logic circuit 809 of TFT formed on the substrate in the embodiment of FIG. 8(B).

In the embodiment of FIG. 8(B), the basic structure of the logic circuit 809 may be designed on the basis of a CMOS circuit, like that in the driver circuits 803 and 804, for which is used the inverse stagger-type TFT of the invention.

TFT of the invention are usable not only as switching elements for AMLCD but also as those for EL (electroluminescent) display devices. In addition, TFT of the invention are usable in circuits for image sensors, etc.

As in the above, TFT of the invention are applicable to various electro-optical devices. The terminology "electro-optical device" as referred to herein includes any and every device for converting electric information into optical information and vice verse.

EXAMPLE 8

AMLCD of Example 6 is usable as the display in various electronic instruments. Electronic instruments as referred to herein are directed to those comprising electro-optical devices such as typically AMLCD.

The electronic instruments include video cameras, still cameras, projectors, projection TV, head-mount displays, car navigations, personal computers (including notebook-type ones), portable information terminals (mobile computers, portable telephones, etc.), etc. Some examples of those electronic instruments are shown in FIG. 9(A) to FIG. 9(F).

Figure 9A:
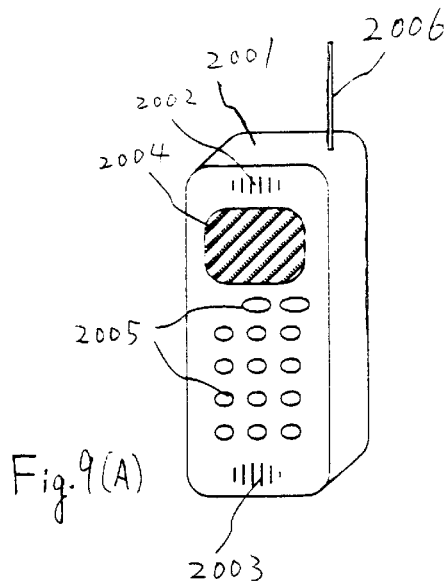
FIG. 9(A) to FIG. 9(F) show examples of electronic instruments.

FIG. 9(A) is a portable telephone. Its body 2001 is provided with a voice-outputting member 2002, a voice-inputting member 2003, a display device 2004, a control switch 2005, and an antenna 2006. In this, the invention is applicable to the display device 2004, etc.

Figure 9B:
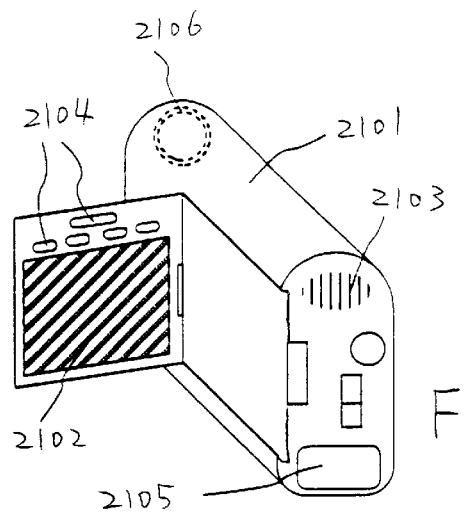

FIG. 9(B) is a video camera. Its body 2101 is provided with a display device 2102, a voice-inputting member 2103, a control switch 2104, a battery 2105, and an image-receiving member 2106. In this, the invention is applicable to the display device 2102.

Figure 9C:
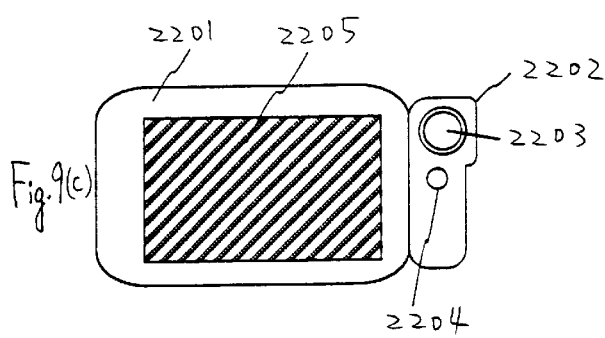

FIG. 9(C) is a mobile computer. Its body 2201 is provided with a camera member 2202, an image-receiving member 2203, a control switch 2204, and a display device 2205. In this, the invention is applicable to the display device 2205, etc.

Figure 9D:
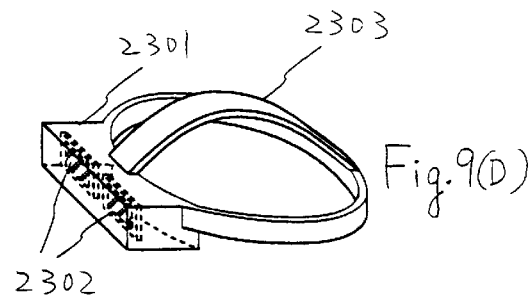

FIG. 9(D) is a head-mount display. Its body 2301 is provided with a display device 2302, and a band member 2303. In this, the invention is applicable to the display device 2302.

Figure 9E:
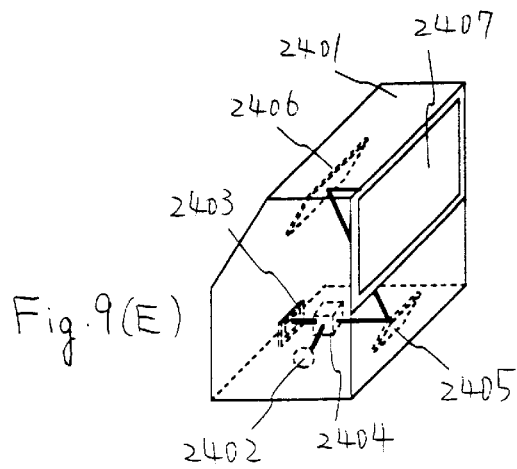

FIG. 9(E) is a rear projector. Its body 2401 is provided with a light source 2402, a display device 2403, a polarized beam splitter 2404, reflectors 2405 and 2406, and a screen 2407. In this, the invention is applicable to the display device 2403.

Figure 9F:
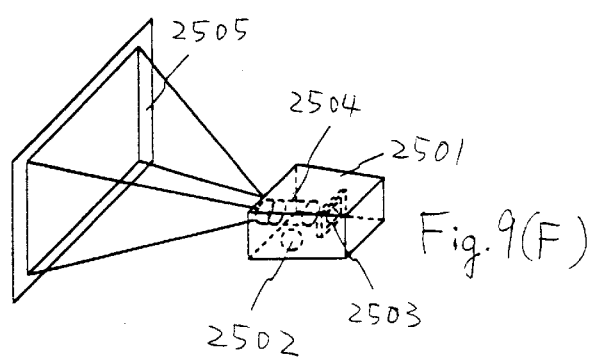

FIG. 9(F) is a front projector. Its body 2501 is provided with a light source 2502, a display device 2503, an optical system 2504, and a screen 2505. In this, the invention is applicable to the display device 2503.

As in the above, the present invention has extremely broad application ranges, and is applicable to various electronic instruments in various fields. Apart from the examples noted above, the invention is applicable to light bulletin boards, advertising propaganda displays, etc.

According to the present invention, a polysilicon film having uniform crystallinity (in which the crystals are uniform in size) is formed through laser crystallization even on a material having high heat absorbability, such as aluminium or copper.

Therefore, according to the invention, it is possible to produce TFT having extremely good operation capabilities, and even to produce semiconductor circuits having rapid responsibility and good operation capabilities.

Moreover, according to the invention, various circuits can be formed on one and the same substrate to realize electro-optical devices having good properties. As a result, the invention improves the quality of electric and electronic instruments comprising parts of such electro-optical devices of high quality.

While the invention has been described in detail and with reference to specific embodiments thereof, it will be apparent to one skilled in the art that various changes and modifications can be made therein without departing from the spirit and scope thereof.

What is claimed is:

1. A method for producing a semiconductor device, which comprises:
    forming a gate electrode over a substrate having an insulating surface,
    forming a heat relaxation layer to cover said gate electrode,
    forming a gate-insulating layer over said heat relaxation layer,
    forming an amorphous silicon film over said gate-insulating layer, and
    exposing said amorphous silicon film to light, to thereby crystallize said film into a polysilicon film;
    wherein heat conductivity of said heat relaxation layer is lower than that of said gate electrode, and
    wherein said heat relaxation layer comprises a material selected from the group consisting of titanium, chromium, tantalum silicide, molybdenum silicide and tungsten silicide.

2. A method according to claim 1, wherein said heat relaxation layer is so patterned that it extends over both edges of said gate electrode within a range of from 1 to 20 μm in a channel direction of said gate electrode.

3. A method according to claim 1, wherein width (L2) of said heat relaxation layer falls between 4 and 40 μm.

4. A method according to claim 1, wherein thickness of said heat relaxation layer falls between 10 and 500 nm.

5. A method according to claim 1, wherein said heat relaxation layer is of a material of which the heat conductivity is not more than 50% of that of said gate electrode.

6. A method according to claim 1, wherein heat conductivity of said heat relaxation layer falls between 10 and 200 $Wm^{-1}K^{-1}$ and electric conductivity thereof falls between $1\times10^4$ and $2\times10^5$ $\Omega^{-1}cm^{-1}$.

7. A method according to claim 1, wherein said heat relaxation layer is of a silicon film to which no impurity is intentionally added.

8. A method according to claim 1, wherein said heat relaxation layer is of a silicon film having one conductivity.

9. A method according to claim 1, wherein said gate electrode is of aluminum or a material consisting essentially of aluminum, or is of copper or a material consisting essentially of copper.

10. A method for producing a semiconductor device, which comprises:

forming a gate electrode over a substrate having an insulating surface, forming a heat relaxation layer to cover said gate electrode, forming a gate-insulating layer over said heat relaxation layer, forming a semiconductor film comprising amorphous silicon over said gate-insulating layer, providing said semiconductor film with a crystallization-promoting element, heating said semiconductor film to thereby crystallize said semiconductor film into a semiconductor film comprising polysilicon, and irradiating said semiconductor film with a light, to thereby improve the crystallinity of said semiconductor film comprising polysilicon, wherein heat conductivity and the electric conductivity of said heat relaxation layer are lower than those of said gate electrode, and wherein said heat relaxation layer comprises a material selected from the group consisting of titanium, chromium, tantalum silicide, molybdenum silicide and tungsten silicide.

11. A method according to claim 10, wherein said heat relaxation layer is so patterned that it extends over both edges of said gate electrode within a range of from 1 to 20 μm in a channel direction of said gate electrode.

12. A method according to claim 10, wherein width (L2) of said heat relaxation layer falls between 4 and 40 μm.

13. A method according to claim 10, wherein thickness of said heat relaxation layer falls between 10 and 500 nm.

14. A method according to claim 10, wherein said heat relaxation layer is of a material of which the heat conductivity is not more than 50% of that of said gate electrode.

15. A method according to claim 10, wherein heat conductivity of said heat relaxation layer falls between 10 and 200 $Wm^{-1}K^{-1}$ and electric conductivity thereof falls between $1\times10^4$ and $2\times10^5$ $\Omega^{-1}cm^{-1}$.

16. A method according to claim 10, wherein said heat relaxation layer is of a silicon film to which no impurity is intentionally added.

17. A method according to claim 10, wherein said heat relaxation layer is of a silicon film having one conductivity.

18. A method according to claim 10, wherein said gate electrode is of aluminum or a material consisting essentially of aluminum, or is of copper or a material consisting essentially of copper.

19. A method according to claim 10 wherein said light is a laser light.

20. A method according to claim 10 wherein said light is an intense light of which intensity is equivalent to that of a laser light.

21. A method according to claim 10 wherein said semiconductor device is a portable telephone.

22. A method according to claim 10 wherein said semiconductor device is a video camera.

23. A method according to claim 10 wherein said semiconductor device is a mobile computer.

24. A method according to claim 10 wherein said semiconductor device is a head-mount display.

25. A method according to claim 10 wherein said semiconductor device is a rear projector.

26. A method according to claim 10 wherein said semiconductor device is a front projector.

* * * * *